United States Patent [19]

Takeda

[11] Patent Number: 4,961,984
[45] Date of Patent: Oct. 9, 1990

[54] TAB FILM TAPE CARRIER

[75] Inventor: Yasushi Takeda, Yokohama, Japan

[73] Assignee: Kabushiki Kaisha Toshiba, Kawasaki, Japan

[21] Appl. No.: 373,581

[22] Filed: Jun. 30, 1989

[30] Foreign Application Priority Data

Jun. 30, 1988 [JP] Japan ................... 63-163561

[51] Int. Cl.⁵ ............................................ B32B 23/02
[52] U.S. Cl. ...................................... 428/192; 428/195;
428/209; 428/901; 206/328; 206/330; 206/332
[58] Field of Search ................... 206/328, 330, 332;
428/195, 209, 192, 901

[56] References Cited

U.S. PATENT DOCUMENTS 4,687,633 8/1987 Miyafuji et al. ................... 420/471
4,827,376 5/1989 Voss ................................. 428/573

Primary Examiner—Patrick Ryan
Attorney, Agent, or Firm—Foley & Lardner, Schwartz, Jeffery, Schwaab, Mack, Blumenthal & Evans

[57] ABSTRACT

A TAB film tape carrier used for making semiconductor devices is described. This TAB film tape carrier comprises a substrate, and copper foil wiring on the substrate and having a predetermined lead form patterned by laminating and etching, the copper foil wiring being made of rolling copper recrystallized by annealing treatment.

1 Claim, 2 Drawing Sheets

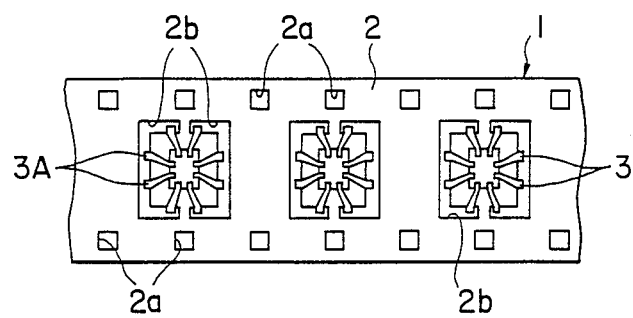
F I G. 1
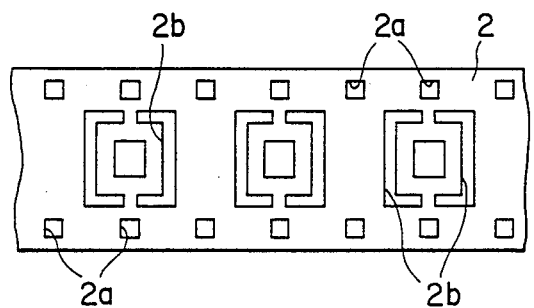
F I G. 2
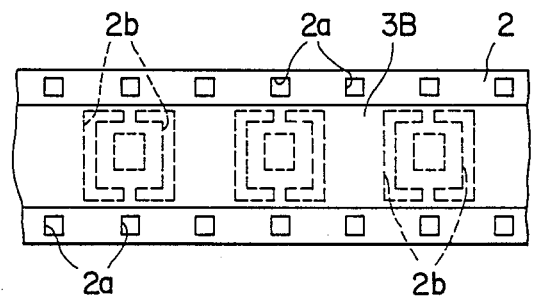
F I G. 3

TAB FILM TAPE CARRIER

FIELD OF THE INVENTION

The present invention relates to a TAB type semiconductor device, and more particularly to a TAB film tape carrier suitable for the tape carrier bonding of thin mounting type or high-density mounting type semiconductor devices.

BACKGROUND OF THE INVENTION

The tape carrier bonding is generally made as follows.

First, a sheet of copper foil is laminated on a substrate of cinema film such as polyimide film having perforations. Then the laminated sheet of copper foil is photo-etched to pattern predetermined lead forms, and the copper foil wiring having the predetermined lead form is either Au plated or Sn plated. A TAB tape carrier is prepared in this way and then, an IC chip having Au bumps or Sn-Pb (solder) bumps is laid on the copper foil wiring of the TAB tape carrier, and the inner lead bonding of the TAB tape carrier made by pressure heating with bonding tools. After that, the TAB tape carrier is positioned in an outer bonder, in accordance with a long lead frame, and the IC chip is punched out from the TAB tape carrier and mounted to the lead frame by heat bonding or welding.

For the copper foil wiring of the TAB film tape, electrolytic copper has been mainly used in the past, taking the facility of etching into account.

However, the electrolytic copper is generally weak with respect to repeat fatigue, and so copper foil wiring made of electrolytic copper is broken when TAB type semiconductors such as the thin mounting type or high-density mounting type are given temperature cycle tests for more than a few hundreds of cycles. Thus, it has been a problem that the lifetime of the copper foil wiring made of electrolytic copper is very short.

SUMMARY OF THE INVENTION

Accordingly, it is an object of this invention to provide a TAB film tape carrier which enhances the reliability of TAB type semiconductor devices, and in particular, lengthens the life with respect to repeat fatigue in temperature cycle tests.

The foregoing object is accomplished by providing a TAB film tape carrier, comprising a substrate and copper foil wiring on the substrate the copper foil wiring being made of rolling copper recrystallized by annealing treatment and having a predetermined lead form patterned by laminating and etching.

In this invention, the copper foil wiring is made of rolling copper, which is much stronger with respect to repeat fatigue than is electrolytic copper, and the rolling copper is recrystallized by annealing treatment, so that the hardness of the copper foil wiring of this invention is lowered extremely, and the elongation of the copper foil wiring becomes much larger compared with that made of electrolytic copper or rolling copper not having undergone annealing treatment. Accordingly, the life of the copper foil wiring of this invention with respect to the repeat fatigue can be lengthened.

BRIEF DESCRIPTION OF THE DRAWINGS

This invention is illustrated diagrammatically in the following drawings wherein:

FIG. 1 is a plan view of one embodiment of a TAB film tape carrier of this invention;

FIG. 2 and FIG. 3 are plan views illustrating successive manufacturing process thereof;

DESCRIPTION OF THE PREFERRED EMBODIMENT

Figure 4:
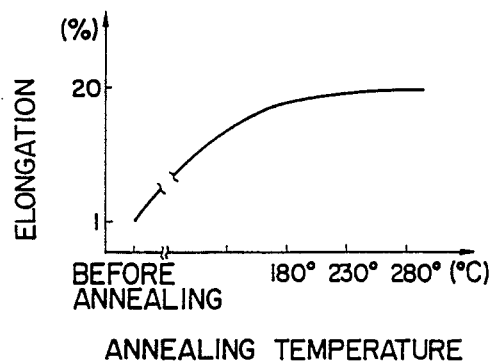
FIG. 4 is a graph showing the relationship between the elongation of copper foil and the annealing temperature.

Referring to the embodiment of the invention in the drawings, FIG. 1 shows a plane view of a TAB film tape carrier. In FIG. 1, the TAB film tape carrier comprises a substrate 2 such as polyimide film which has perforations 2a formed in series on each side thereof and predetermined holes 2b for IC chips, and copper foil wiring 3A which is patterned with a predetermined lead form on the upper surface of the substrate 2. The copper foil wiring 3A are Au plated or Sn plated.

For example, patterning of the copper foil wiring 3A is as follows. As shown in FIGS. 2, the perforations 2a and the predetermined holes 2b are punched in the substrate 2, and then as shown in FIG. 3, a sheet of copper foil 3B is laminated onto the substrate 2, and the laminated sheet of copper foil 3B is photo-etched.

For the copper foil wiring 3A, electrolytic copper has been conventionally used, but in this invention, rolling copper which is recrystallized by annealing treatment is used.

Namely, the copper foil wiring 3A is made of rolling copper recrystallized by annealing treatment which consists of, for example, heating at 180°~280° C. and cooling slowly after holding at such temperature for about 1 hour.

Incidentally, recrystallization is a softening phenomenon in which new crystals having no strain are generated in the grain boundaries of worked grains at a recrystallized temperature region, and then new crystals gradually multiply and the worked grain grows smaller until it vanishes. Generally, the recrystallized temperature of copper is about 200° C.

Annealing is generally used for removing internal stress generated by work, decreasing the hardness, regulating the grain structure, and obtaining high mechanical, physical and other qualities. On the other hand, in this invention annealing is mainly used for extending the life with respect to repeat fatigue by decreasing the hardness and increasing elongation.

Namely, FIG. 4 shows the relationship between the annealing temperature (°C.) and the elongation of the copper foil (%). FIG. 4 also shows the data of the elongation of the copper foil when the copper foil is heated and held for about 1 hour at each annealing temperature. In FIG. 4, it is clearly understood that the elongation of the annealing treatment for about 1 hour at more than 180° C. is about 20%, which is much larger than elongation for no annealing treatment, or about 1%.

Figure 5:
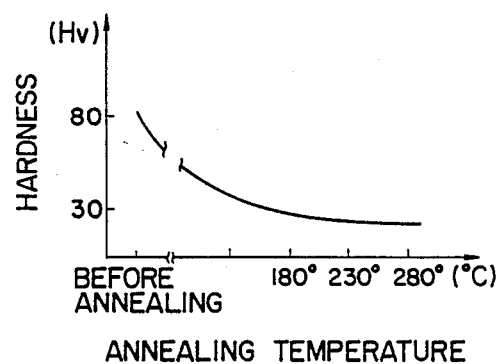
FIG. 5 is a graph showing the relationship between the hardness of copper foil and the annealing temperature.

FIG. 5 shows the relationship between the annealing temperature (°C.) and the hardness (Vickers hardness) of the copper foil Hv, namely, this drawing shows the data of the hardness of the copper foil when the copper foil is heated and held for about 1 hour at each annealing temperature. In FIG. 5, it is understood that the hardness Hv of the annealing treatment for about 1 hour at more than 180° C., is 20~35, which is much lower than the hardness Hv for no annealing treatment, or about 80.

Figure 6:
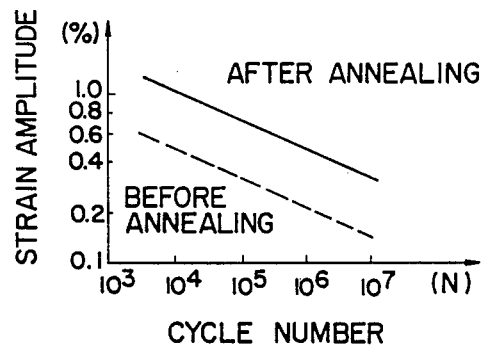
FIG. 6 is a graph of the S-N curve showing the fatigue limits for with annealing treatment and for without annealing treatment.

Next, FIG. 6 shows the S-N curves for the fatigue tests of the copper foil in the annealing treatment for about 1 hour and at about 180° C., and for no annealing treatment respectively. FIG. 6 has the cycle number (N) along the horizontal axis and the strain amplitude (%) being proportional to the stress along the vertical axis. In FIG. 6, it is understood that for the same strain amplitude (%), copper foil having undergone annealing treatment is much stronger with respect to repeat fatigue than that which has not.

Incidentally, it is assured by the results of experimental tests, that copper foil made of recrystallized rolling copper has its electrical resistance reduced by about 0.05 $\Omega\mu$cm and are very suitable for substrate wiring. The resistance of the copper foil is greatly lowered by the annealing treatment, so that bonding damage to IC chip having the copper foil wiring can be reduced.

What is claimed is:

1. A TAB film tape carrier, comprising a substrate and copper foil wiring on the substrate having a predetermined lead form patterned by laminating and etching, the copper foil wiring being made of rolling copper recrystallized by annealing treatment, wherein the annealing treatment comprises heating the copper foil at about 180°-280° C., maintaining the copper foil at that temperature for about one hour and then cooling the heated copper foil slowly so that the elongation of the copper foil is about 20% and the Vickers hardness of the copper foil is about 20 to 35 Hv.

* * * * *